(12) United States Patent
Suzuki

(10) Patent No.: US 10,926,524 B1
(45) Date of Patent: Feb. 23, 2021

(54) REMOVAL METHOD OF CARRIER PLATE

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 17/003,462

(22) Filed: Aug. 26, 2020

(30) Foreign Application Priority Data

Aug. 26, 2019 (JP) .............................. JP2019-153398

(51) Int. Cl.
*B32B 43/00* (2006.01)
*H01L 21/683* (2006.01)
*B32B 38/10* (2006.01)

(52) U.S. Cl.
CPC ........ B32B 43/006 (2013.01); H01L 21/6835 (2013.01); *B32B 38/10* (2013.01); *B32B 2310/028* (2013.01); *H01L 2221/68386* (2013.01); *Y10T 156/1111* (2015.01); *Y10T 156/1121* (2015.01); *Y10T 156/1126* (2015.01); *Y10T 156/1168* (2015.01); *Y10T 156/1184* (2015.01); *Y10T 156/1922* (2015.01); *Y10T 156/1928* (2015.01); *Y10T 156/1933* (2015.01)

(58) Field of Classification Search
CPC .. B32B 38/10; B32B 43/006; Y10T 156/1111; Y10T 156/1121; Y10T 156/1126; Y10T 156/1168; Y10T 156/1184; Y10T 156/1922; Y10T 156/1928; Y10T 156/1933
See application file for complete search history.

(56) References Cited

U.S. PATENT DOCUMENTS

| 6,066,229 A * | 5/2000 | Komine | B29C 63/0013 156/718 |
| 8,701,734 B2 * | 4/2014 | Nakamura | H01L 21/67092 156/758 |
| 9,472,437 B2 * | 10/2016 | George | H01L 21/6838 |
| 2004/0188861 A1 * | 9/2004 | Kurimoto | H01L 24/27 257/786 |
| 2005/0173064 A1 * | 8/2005 | Miyanari | H01L 21/6835 156/703 |
| 2007/0062644 A1 * | 3/2007 | Nakamura | B29C 63/0013 156/703 |

(Continued)

FOREIGN PATENT DOCUMENTS

JP 2016201519 A 12/2016

*Primary Examiner* — Mark A Osele
*Assistant Examiner* — Nickolas R Harm
(74) *Attorney, Agent, or Firm* — Greer Burns & Crain Ltd.

(57) ABSTRACT

There is provided a removal method of a carrier plate used when the carrier plate is removed from a workpiece bonded to a region excluding an outer rim part in a front surface of the carrier plate by a temporary bonding layer disposed on the whole of the front surface of the carrier plate. This removal method of a carrier plate includes a temporary bonding layer removal step of removing part or all of an outer rim part of the temporary bonding layer, a holding step of holding the workpiece from the upper side by a holding unit after removing part or all of the outer rim part of the temporary bonding layer, and a carrier plate removal step of removing the carrier plate from the workpiece by applying a downward force to the outer rim part of the carrier plate from the side of the front surface.

14 Claims, 4 Drawing Sheets

(56) References Cited

U.S. PATENT DOCUMENTS

| | | | |
|---|---|---|---|
| 2009/0218050 A1* | 9/2009 | Nakamura | H01L 21/67132 156/754 |
| 2011/0048611 A1* | 3/2011 | Carre | H01L 21/6836 156/73.1 |
| 2013/0025796 A1* | 1/2013 | Burggraf | B32B 37/025 156/703 |
| 2015/0325465 A1* | 11/2015 | Iwata | H01L 21/6836 156/703 |

* cited by examiner

REMOVAL METHOD OF CARRIER PLATE

BACKGROUND OF THE INVENTION

Field of the Invention

The present invention relates to a removal method of a carrier plate used when the carrier plate is removed from a workpiece bonded to a surface of the carrier plate by a temporary bonding layer.

Description of the Related Art

In electronic equipment typified by mobile phones and personal computers, a device chip including a device such as an electronic circuit is an essential constituent element. The device chip is obtained by segmenting a surface of a wafer composed of a semiconductor material such as silicon into plural regions by planned dividing lines (streets) and forming devices in the respective regions and thereafter dividing the wafer along these planned dividing lines, for example.

For example, the device chip obtained by a method like the above-described one is fixed to a mother substrate for a chip size package (CSP) and is electrically connected to a terminal or the like of this mother substrate by a method such as wire bonding and then is sealed by a mold resin. A package device is formed through sealing the device chip by the mold resin as above. This makes it possible to protect the device chip from external factors such as shock, light, heat, and water.

In recent years, a package technique called the fan-out wafer level package (FOWLP), in which package terminals are formed outside the region of a device chip by using a wafer-level redistribution technique, has begun to be employed (for example, refer to Japanese Patent Laid-open No. 2016-201519). Furthermore, a package technique called the fan-out panel level packaging (FOPLP), in which package devices are collectively manufactured at a level of a panel (typically glass substrate used for manufacturing of a liquid crystal panel) with a larger size than the wafer, has also been proposed.

In the FOPLP, for example, a redistribution layer (RDL) is formed over a surface of a carrier plate that serves as a temporary substrate with the intermediary of a temporary bonding layer and device chips are joined to this redistribution layer. Next, the device chips are sealed by a mold resin to obtain a package panel. Thereafter, the package panel is thinned by a method such as grinding and then this package panel is divided. Thereby, the package devices are completed.

SUMMARY OF THE INVENTION

In the above-described FOPLP, for example, after the package panel is divided into the package devices, the carrier plate is removed from these package devices. Specifically, each package device is picked up from the carrier plate. However, when the size of the package device is small, it is difficult to pick up this package device from the carrier plate.

On the other hand, it is also conceivable that the carrier plate is separated from the package panel to be removed before the package panel is divided into the package devices. However, the bonding force of the temporary bonding layer is strong to some extent and therefore it is difficult to separate the carrier plate from the package panel without damaging the package panel and the carrier plate.

Thus, an object of the present invention is to provide a removal method of a carrier plate that can easily remove the carrier plate from a workpiece such as a package panel.

In accordance with an aspect of the present invention, there is provided a removal method of a carrier plate used when the carrier plate is removed from a workpiece bonded to a region excluding an outer rim part in a front surface of the carrier plate by a temporary bonding layer disposed on the whole of the front surface of the carrier plate. The removal method includes a temporary bonding layer removal step of removing part or all of an outer rim part of the temporary bonding layer, a holding step of holding the workpiece from the upper side by a holding unit after removing part or all of the outer rim part of the temporary bonding layer, and a carrier plate removal step of removing the carrier plate from the workpiece by applying a downward force to the outer rim part of the carrier plate from the side of the front surface of the carrier plate by a push component and moving the carrier plate in such a direction as to get further away from the workpiece in a state that the workpiece is held from the upper side.

In the aspect of the present invention, in the carrier plate removal step, the downward force is applied to the outer rim part of the carrier plate and the carrier plate is removed from the workpiece after a fluid is sprayed between the workpiece and the carrier plate or while the fluid is sprayed between the workpiece and the carrier plate, in some cases.

Furthermore, in the aspect of the present invention, in the carrier plate removal step, the downward force may be applied to the outer rim part of the carrier plate in a state that the workpiece and the carrier plate are immersed in a liquid. In addition, a surfactant may be contained in the liquid.

Moreover, in the aspect of the present invention, in the carrier plate removal step, the downward force may be applied to the outer rim part of the carrier plate while vibration is given to the push component in a state that the workpiece and the carrier plate are immersed in the liquid.

Furthermore, in the aspect of the present invention, in the carrier plate removal step, the downward force may be applied to the outer rim part of the carrier plate while vibration is given to the liquid in a state that the workpiece and the carrier plate are immersed in the liquid.

In the removal method of a carrier plate according to the aspect of the present invention, by removing at least part of the outer rim part of the temporary bonding layer, a part firmly fixed to the carrier plate in the outer rim part of the temporary bonding layer is isolated from the central part of the temporary bonding layer that bonds the carrier plate and the workpiece.

Thus, by holding the workpiece from the upper side by the holding unit and applying the downward force to the outer rim part of the carrier plate, the carrier plate can be easily removed from the workpiece without being affected by the part firmly fixed to the carrier plate in the outer rim part of the temporary bonding layer. Furthermore, the gravitational force that acts on the carrier plate can be used in addition to the downward force applied to the outer rim part of the carrier plate and therefore a large force is not needed when the carrier plate is removed from the workpiece.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1A:
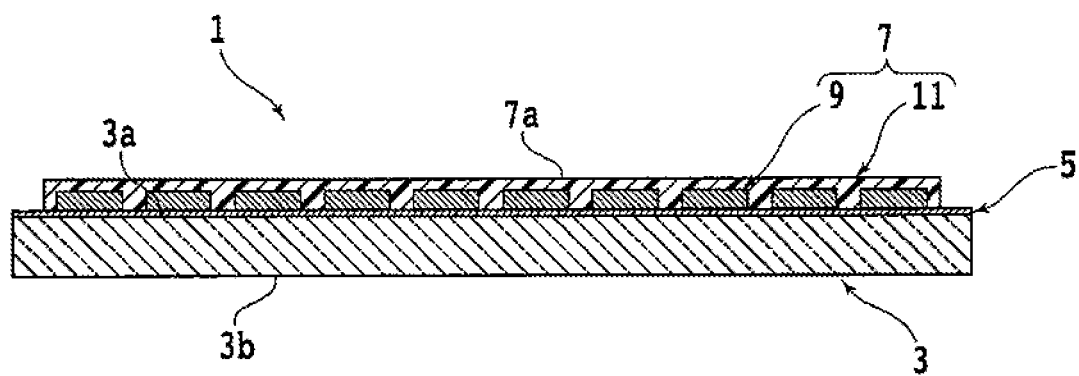
FIG. 1A is a sectional view depicting a configuration example of a composite substrate including a carrier plate and a workpiece.
Figure 1B:
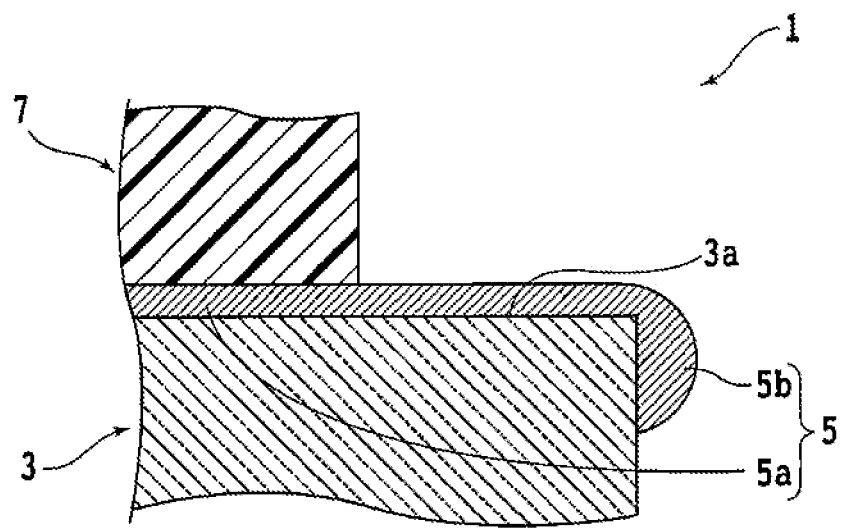
FIG. 1B is an enlarged sectional view depicting part of FIG. 1A.

An embodiment according to one aspect of the present invention will be described with reference to the accompanying drawings. FIG. 1A is a sectional view depicting a configuration example of a composite substrate 1 used in a removal method of a carrier plate according to the present embodiment. FIG. 1B is an enlarged sectional view depicting part of FIG. 1A. The composite substrate 1 includes a carrier plate 3 formed of an insulator material such as soda glass, borosilicate glass, or quartz glass.

The carrier plate 3 has a first surface (front surface) 3a that is substantially flat and a second surface (back surface) 3b on the opposite side to the first surface 3a, and the shape thereof as viewed from the side of the first surface 3a or the side of the second surface 3b is formed into a rectangular flat plate shape. For example, the thickness of the carrier plate 3 is equal to or smaller than 2 mm, typically 1.1 mm.

Although the carrier plate 3 composed of an insulator material such as soda glass, borosilicate glass, or quartz glass is used in the present embodiment, there is no particular limit to the material, shape, structure, size, and so forth of the carrier plate 3. For example, it is also possible to use a plate composed of a material such as a semiconductor, ceramic, resin, or metal as the carrier plate 3. A circular-disc-shaped plate such as a semiconductor wafer may be used as the carrier plate 3.

A workpiece 7 is bonded to the first surface 3a of the carrier plate 3 with the intermediary of a temporary bonding layer 5. The temporary bonding layer 5 is disposed on substantially the whole of the first surface 3a by overlapping a metal film, insulator film, or the like, for example. The temporary bonding layer 5 is formed of a resin film or the like that functions as an adhesive in some cases.

For example, the thickness of the temporary bonding layer 5 is equal to or smaller than 20 μm, typically 5 μm. The temporary bonding layer 5 includes a central part 5a that bonds the carrier plate 3 and the workpiece 7 and an outer rim part 5b that covers the outer rim part of the first surface 3a of the carrier plate 3, and so forth. That is, the workpiece 7 is bonded to the region excluding the outer rim part of the first surface 3a in the carrier plate 3. Part of the outer rim part 5b is firmly fixed to the carrier plate 3 and does not easily peel off.

When the carrier plate 3 is separated and removed from the workpiece 7, the central part 5a of the temporary bonding layer 5 is split into a first part 5c (see FIG. 3C) in tight contact with the side of the carrier plate 3 and a second part 5d (see FIG. 3C) in tight contact with the side of the workpiece 7. Before the carrier plate 3 is separated from the workpiece 7, part of the outer rim part 5b firmly fixed to the carrier plate 3 is isolated from the central part 5a in order for the central part 5a to be properly split.

The workpiece 7 is referred to also as package panel, package wafer, and so forth, for example, and includes a redistribution layer (RDL) (not depicted) in contact with the central part 5a of the temporary bonding layer 5, plural device chips 9 joined to the redistribution layer, and a mold resin layer 11 that seals each device chip 9. The workpiece 7 is formed into a flat plate shape similar to the carrier plate 3, for example.

Furthermore, the size of the workpiece 7 when the workpiece 7 is viewed from the side of a first surface (front surface) 7a (on the opposite side to the temporary bonding layer 5) is smaller than the size of the carrier plate 3 when the carrier plate 3 is viewed from the side of the first surface 3a or the side of the second surface 3b. In addition, for example, the thickness of the workpiece 7 is equal to or smaller than 1.5 mm, typically 0.6 mm.

The side of the first surface 7a of the workpiece 7 may be processed by a method such as grinding. Furthermore, planned dividing lines are set in regions between the device chips 9 adjacent in the workpiece 7. For example, by cutting the workpiece 7 along any planned dividing lines, the workpiece 7 is divided into plural workpiece pieces each including one or plural device chips 9.

Moreover, when the workpiece 7 (or workpiece pieces) is cut along all planned dividing lines, plural package devices corresponding to the respective device chips 9 are obtained. However, there is no particular limit to the material, shape, structure, size, and so forth of the workpiece 7. For example, the workpiece 7 is composed mainly of the redistribution layer and does not include the device chips 9, the mold resin layer 11, and so forth in some cases.

Figure 2A:
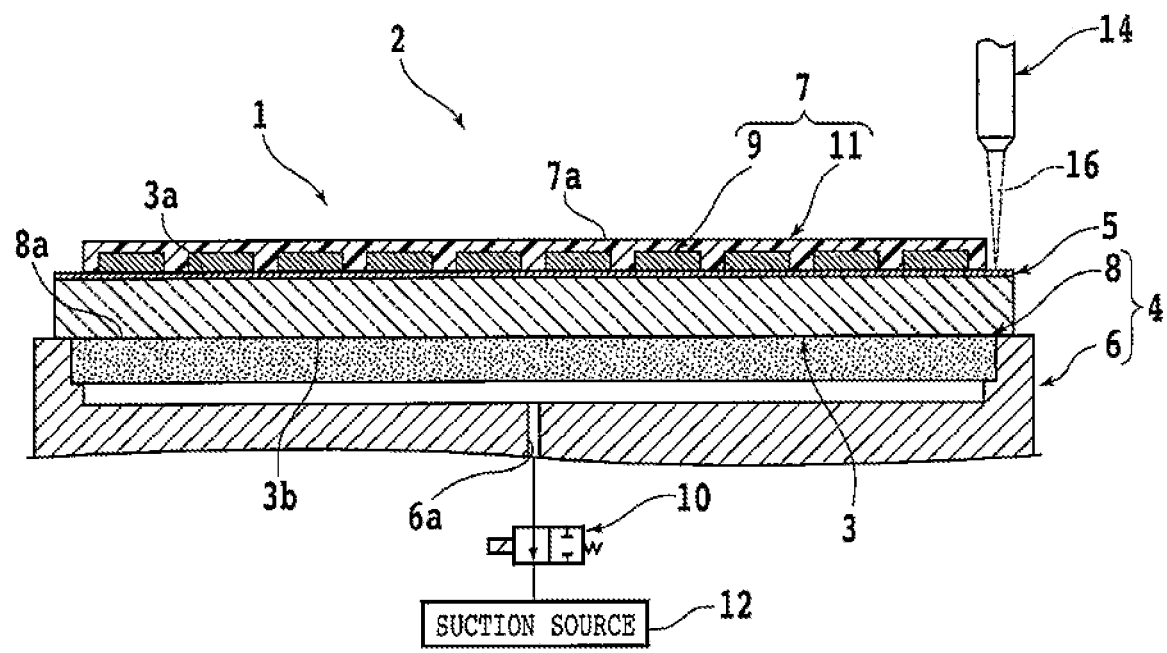
FIG. 2A is a sectional view depicting how part of an outer rim part of a temporary bonding layer is removed.
Figure 2B:
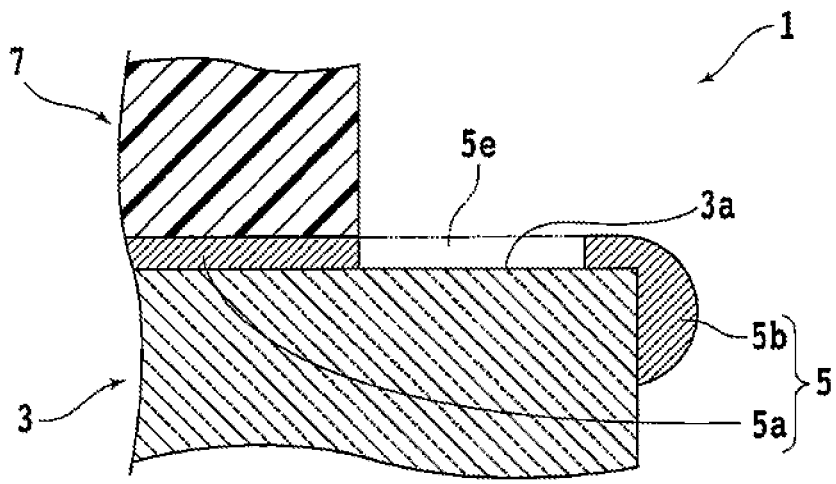
FIG. 2B is a sectional view depicting the state in which part of the outer rim part of the temporary bonding layer has been removed.

In the removal method of a carrier plate according to the present embodiment, first, at least part of the outer rim part 5b of the temporary bonding layer 5 is removed (temporary bonding layer removal step). FIG. 2A is a sectional view depicting how part of the outer rim part 5b of the temporary bonding layer 5 is removed. FIG. 2B is a sectional view depicting the state in which part of the outer rim part 5b of the temporary bonding layer 5 has been removed.

When part of the outer rim part 5b is removed, a laser processing apparatus 2 depicted in FIG. 2A is used. The laser processing apparatus 2 includes a chuck table 4 for holding the composite substrate 1. For example, the chuck table 4 includes a circular cylindrical frame body 6 composed of a metal material typified by stainless steel and a holding plate 8 that is composed of a porous material and is disposed at the upper part of the frame body 6.

The upper surface of the holding plate 8 is a holding surface 8a for sucking and holding the carrier plate 3 of the composite substrate 1. The lower surface side of the holding plate 8 is connected to a suction source 12 through a flow path 6a made inside the frame body 6, a valve 10, and so forth. Thus, when the valve 10 is opened, a negative pressure of the suction source 12 can be made to act on the holding surface 8a.

The chuck table 4 (frame body 6) is coupled to a rotational drive source (not depicted) such as a motor and rotates around a rotation axis substantially perpendicular to the above-described holding surface 8a by a force generated by this rotational drive source. Furthermore, the chuck table 4 (frame body 6) is supported by a movement mechanism (not depicted) and moves in a processing feed direction substantially parallel to the above-described holding surface 8a and an indexing feed direction that is substantially parallel to the holding surface 8a and is substantially perpendicular to the processing feed direction.

As depicted in FIG. 2A, a laser irradiation unit 14 is disposed above the chuck table 4. The laser irradiation unit 14 includes a laser oscillator (not depicted) that can generate a laser beam 16 with such a wavelength as to be absorbed by the temporary bonding layer 5 and an optical system (not depicted) that guides the laser beam 16 to the composite substrate 1 held by the chuck table 4.

When part of the outer rim part 5b is removed, first, the carrier plate 3 of the composite substrate 1 is held by the chuck table 4 and the side of the workpiece 7 is exposed upward. That is, as depicted in FIG. 2A, the second surface 3b of the carrier plate 3 is brought into contact with the holding surface 8a of the chuck table 4. Thereafter, the valve 10 is opened and a negative pressure of the suction source 12 is made to act on the holding surface 8a.

After the composite substrate 1 is held by the chuck table 4, the outer rim part 5b of the temporary bonding layer 5 exposed upward is irradiated with the laser beam 16 and part 5e of the outer rim part 5b is removed as depicted in FIG. 2B. Specifically, while the laser beam 16 is emitted downward from a laser beam emission port of the laser irradiation unit 14, this laser beam emission port of the laser irradiation unit 14 is relatively moved along the part 5e of the outer rim part 5b of the temporary bonding layer 5.

The part 5e of the outer rim part 5b as the target of removal is set at a position at a distance of 1 mm to 3 mm from the outer rim of the temporary bonding layer 5 (or carrier plate 3) in such a manner as to surround the central part 5a of the temporary bonding layer 5, for example. That is, an annular region that surrounds the central part 5a is set as the target of removal. However, there is no particular limit to the position of the part 5e of the outer rim part 5b. Furthermore, the condition of the irradiation with the laser beam 16 is adjusted in a range in which the part 5e of the outer rim part 5b can be removed by ablation.

Due to this, as depicted in FIG. 2A, the part 5e of the outer rim part 5b is irradiated with the laser beam 16 from the upper side and the part 5e of the outer rim part 5b can be removed. That is, part of the outer rim part 5b firmly fixed to the carrier plate 3 is isolated from the central part 5a, so that it becomes possible to easily separate the carrier plate 3 from the workpiece 7. Although only the part 5e of the outer rim part 5b is removed in the present embodiment, the whole of the outer rim part 5b may be removed.

Figure 3A:
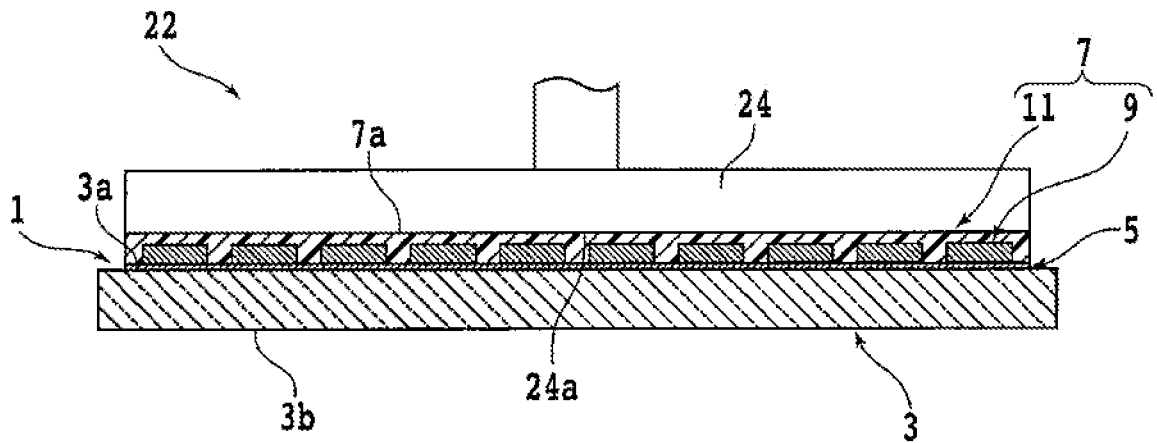
FIG. 3A is a sectional view depicting how the workpiece is held from the upper side.

After the part 5e of the outer rim part 5b of the temporary bonding layer 5 has been removed, the workpiece 7 of the composite substrate 1 is held from the upper side (holding step). FIG. 3A is a sectional view depicting how the workpiece 7 is held from the upper side. When the workpiece 7 is held from the upper side, a separating apparatus 22 depicted in FIG. 3A and so forth is used. The separating apparatus 22 includes a holding unit 24 for holding the workpiece 7 of the composite substrate 1 from the upper side.

At the lower part of the holding unit 24, a holding surface 24a having a size equivalent to the size of the first surface 7a of the workpiece 7 is formed. A suction source (not depicted) is connected to the holding surface 24a through a flow path (not depicted), a valve (not depicted), and so forth. Thus, a negative pressure of the suction source acts on the holding surface 24a when the valve is opened. Furthermore, the holding unit 24 is supported by a rising-lowering mechanism (not depicted) and moves in the vertical direction.

When the workpiece 7 is held from the upper side, as depicted in FIG. 3A, for example, in the state in which the workpiece 7 is positioned above the carrier plate 3, the holding surface 24a of the holding unit 24 is brought into contact with the first surface 7a of the workpiece 7. Then, the valve is opened and a negative pressure of the suction source is made to act on the holding surface 24a. Thereby, the workpiece 7 of the composite substrate 1 is held by the holding unit 24 from the upper side.

In the present embodiment, the first surface 7a of the workpiece 7 is brought into direct contact with the holding surface 24a of the holding unit 24. However, a porous sheet or the like may be made to intervene between the first surface 7a of the workpiece 7 and the holding surface 24a of the holding unit 24. This makes it possible to prevent damage, contamination, and so forth of the workpiece 7 attributed to the contact with the holding surface 24a.

Figure 3B:
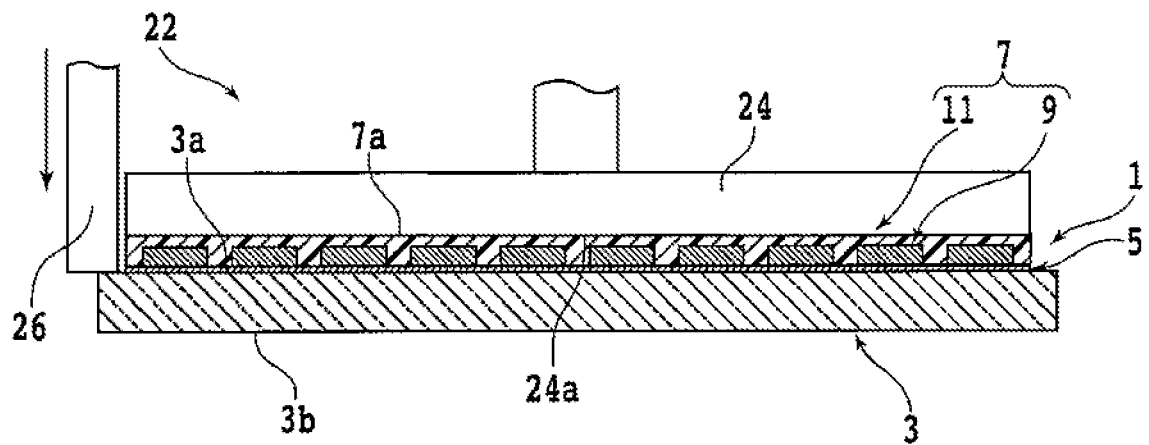
FIG. 3B is a sectional view depicting how a downward force is applied to an outer rim part of the carrier plate.
Figure 3C:
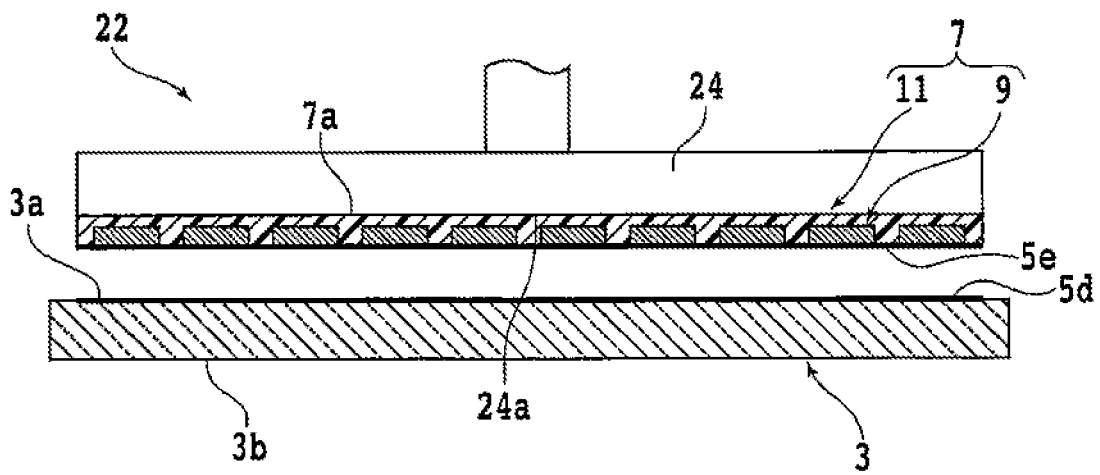
FIG. 3C is a sectional view depicting the state in which the carrier plate has been removed from the workpiece.

After the workpiece 7 is held from the upper side, the carrier plate 3 is separated and removed from the workpiece 7 by applying a downward force to an outer rim part of the carrier plate 3 (carrier plate removal step). FIG. 3B is a sectional view depicting how a downward force is applied to the outer rim part of the carrier plate 3. FIG. 3C is a sectional view depicting the state in which the carrier plate 3 has been removed from the workpiece 7. When the carrier plate 3 is separated and removed from the workpiece 7, continuously the separating apparatus 22 is used.

As depicted in FIG. 3B, on a lateral side of the holding unit 24, a bar-shaped push component 26 is disposed at a position corresponding to the outer rim part of the carrier plate 3 of the composite substrate 1 held by the holding unit 24. For example, the push component 26 is supported by a different rising-lowering mechanism (not depicted) from the rising-lowering mechanism that moves the holding unit 24 and moves in the vertical direction independently of the holding unit 24.

When the carrier plate 3 is removed from the workpiece 7, first, the holding unit 24 and the push component 26 are both moved upward and the composite substrate 1 held by the holding unit 24 is lifted up. That is, the side of the second surface 3b of the carrier plate 3 is exposed downward. Next, the push component 26 is moved downward with the position of the holding unit 24 kept, and the lower end of the push component 26 is brought into contact with the outer rim part of the carrier plate 3. That is, a downward force is applied to the outer rim part of the carrier plate 3 by the push component 26.

As described above, the workpiece 7 of the composite substrate 1 is held by the holding unit 24 from the upper side. Thus, when a downward force is applied to the outer rim part of the carrier plate 3 by the push component 26, the carrier plate 3 is separated from the workpiece 7, with the temporary bonding layer 5 being the boundary, and drops. That is, the carrier plate 3 moves in such a direction as to get further away from the workpiece 7. In the present embodiment, part of the outer rim part 5b firmly fixed to the carrier plate 3 is isolated from the central part 5a and therefore the carrier plate 3 can be easily separated and removed from the workpiece 7.

As described above, in the removal method of a carrier plate according to the present embodiment, the temporary bonding layer 5 is irradiated with the laser beam 16 with such a wavelength as to be absorbed by the temporary bonding layer 5 and at least the part 5e of the outer rim part 5b of the temporary bonding layer 5 is removed. Thereby, the part firmly fixed to the carrier plate 3 in the outer rim part 5b of the temporary bonding layer 5 is isolated from the central part 5a of the temporary bonding layer 5 that bonds the carrier plate 3 and the workpiece 7.

Thus, by holding the workpiece 7 from the upper side by the holding unit 24 and applying a downward force to the outer rim part of the carrier plate 3, the carrier plate 3 can be easily removed from the workpiece 7 without being affected by the part firmly fixed to the carrier plate 3 in the outer rim part 5b. Furthermore, the gravitational force that acts on the carrier plate 3 can be used in addition to the downward force applied to the outer rim part of the carrier plate 3 and therefore a large force is not needed when the carrier plate 3 is removed from the workpiece 7.

The present invention is not limited to the description of the above-described embodiment and can be carried out with various changes. For example, in the above-described embodiment, at least the part 5e of the outer rim part 5b is removed by the method in which irradiation with the laser beam 16 is executed from the side of the workpiece 7 on the upper side. However, it is also possible to remove at least the part 5e of the outer rim part 5b by a method in which irradiation with a laser beam is executed from the side of the carrier plate 3 on the lower side. In this case, a laser beam with such a wavelength as to be transmitted through the carrier plate 3 and be absorbed by the temporary bonding layer 5 is used.

Similarly, in the above-described embodiment, at least the part 5e of the outer rim part 5b of the temporary bonding layer 5 is removed by the method in which the temporary bonding layer 5 is irradiated with the laser beam 16. However, at least the part 5e of the outer rim part 5b may be removed by another method. For example, at least the part 5e of the outer rim part 5b can be removed by a method in which a cutting blade or the like is made to cut into the temporary bonding layer 5.

Furthermore, for example, the push component 26 in the above-described embodiment is configured to be capable of moving in the vertical direction independently of the holding unit 24. However, it suffices that the push component 26 can move at least relative to the holding unit 24.

Therefore, for example, the push component 26 may be fixed to a casing (not depicted) of the separating apparatus 22 or the like and the push component 26 may be moved relative to the holding unit 24 by moving only the holding unit 24. Furthermore, although one push component 26 is used in the above-described embodiment, it is also possible to use plural push components 26.

Figure 4A:
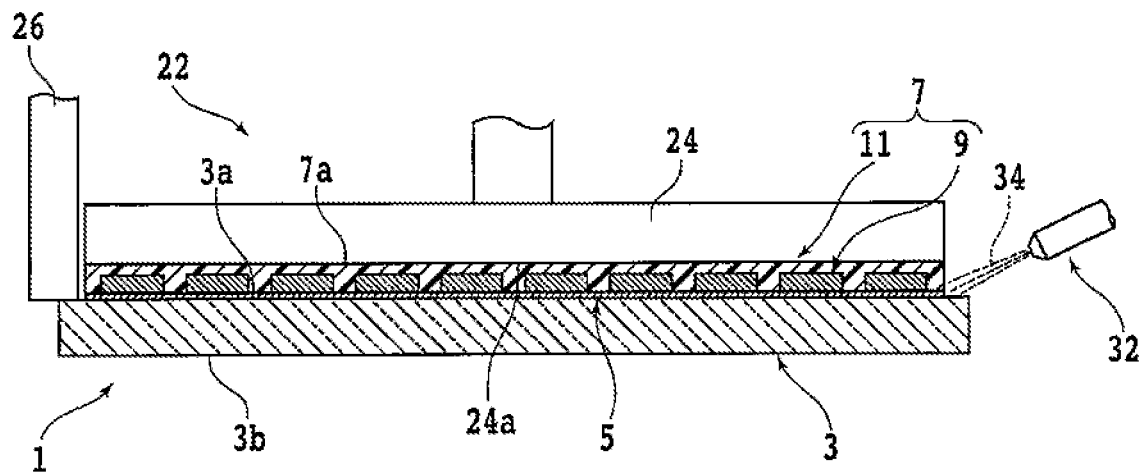
FIG. 4A is a sectional view depicting how the carrier plate is removed from the workpiece by a removal method of a carrier plate according to a first modification example.

Moreover, it is also possible to spray fluid onto the temporary bonding layer 5 exposed between the carrier plate 3 and the workpiece 7 when the carrier plate 3 is separated and removed from the workpiece 7. FIG. 4A is a sectional view depicting how the carrier plate 3 is removed from the workpiece 7 by a removal method of a carrier plate according to a first modification example. A large part of the removal method of a carrier plate according to the first modification example is in common with the removal method of a carrier plate according to the above-described embodiment. Thus, in the following, a description will be made mainly about the difference and detailed description of the common part is omitted.

As depicted in FIG. 4A, a nozzle 32 is disposed on a lateral side of the holding unit 24 of the separating apparatus 22 used in this first modification example. A supply source (not depicted) of fluid 34 is connected to the nozzle 32 through a flow path (not depicted), a valve (not depicted), and so forth.

After the fluid 34 is sprayed from the nozzle 32 onto the temporary bonding layer 5 exposed between the carrier plate 3 and the workpiece 7 or while the fluid 34 is sprayed onto the temporary bonding layer 5 exposed between the carrier plate 3 and the workpiece 7, a downward force is applied to the outer rim part of the carrier plate 3 by the push component 26. This can separate the carrier plate 3 from the workpiece 7 more easily. As the fluid 34 sprayed between the carrier plate 3 and the workpiece 7, air, water, or the like can be used, for example. However, there is no particular limit to the kind and so forth of the fluid 34.

Figure 4B:
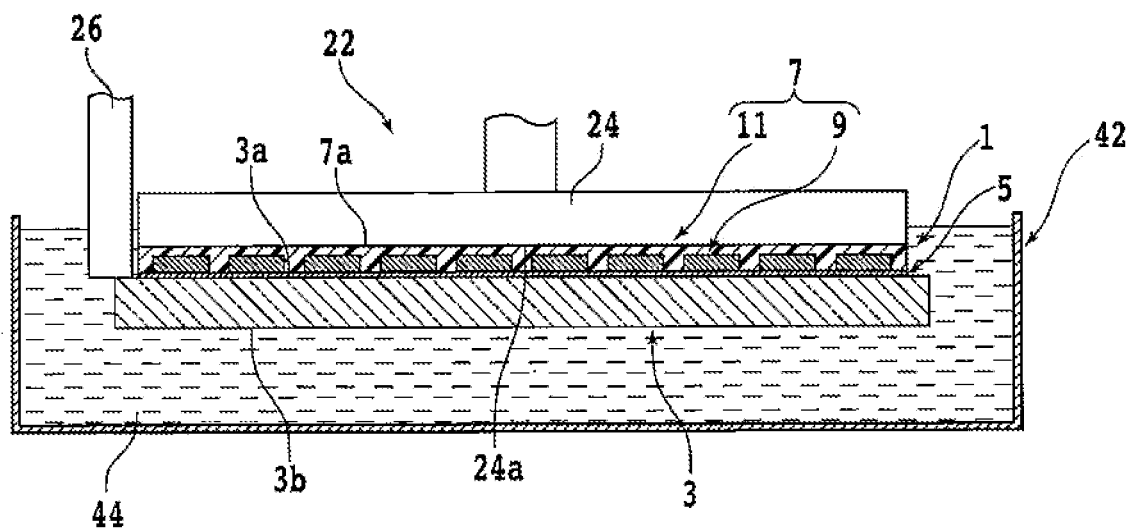
FIG. 4B is a sectional view depicting how the carrier plate is removed from the workpiece by a removal method of a carrier plate according to a second modification example.

Furthermore, when the carrier plate 3 is separated and removed from the workpiece 7, the carrier plate 3 and the workpiece 7 may be immersed in a liquid. FIG. 4B is a sectional view depicting how the carrier plate 3 is removed from the workpiece 7 by a removal method of a carrier plate according to a second modification example. A large part of the removal method of a carrier plate according to the second modification example is in common with the removal method of a carrier plate according to the above-described embodiment. Thus, in the following, a description will be made mainly about the difference and detailed description of the common part is omitted.

As depicted in FIG. 4B, a tank 42 with such a size as to allow the carrier plate 3 and the workpiece 7 to be housed therein is disposed below the holding unit 24 of the separating apparatus 22 used in this second modification example. A liquid 44 such as water is accumulated in the tank 42.

In the state in which the carrier plate 3 and the workpiece 7 are immersed in the liquid 44 in the tank 42, a downward force is applied to the outer rim part of the carrier plate 3 by the push component 26 and the carrier plate 3 is separated from the workpiece 7. Thereupon, the carrier plate 3 separated from the workpiece 7 drops in the liquid 44. As a result, shock accompanying the drop becomes small compared with the case of causing the carrier plate 3 to drop in air. This can prevent damage on the carrier plate 3, vibration of the separating apparatus 22, and so forth.

A surfactant may be contained in the liquid 44. As the surfactant contained in the liquid 44, an anionic surfactant, cationic surfactant, or the like that easily enters the temporary bonding layer 5 can be used. Through making the liquid 44 contain the surfactant that easily enters the temporary bonding layer 5 as above, it becomes easier for the temporary bonding layer 5 to split from the region which the surfactant enters and the carrier plate 3 can be removed from the workpiece 7 more easily.

Furthermore, in the second modification example, when a downward force is applied to the outer rim part of the carrier plate 3 by the push component 26 after the carrier plate 3 and the workpiece 7 are immersed in the liquid 44, vibration of ultrasonic waves or the like may be given to the push component 26. Specifically, while the vibration of ultrasonic waves or the like is given to the push component 26, the downward force is applied to the outer rim part of the carrier plate 3 by the push component 26. In this case, due to action of the vibration transmitted from the push component 26, it becomes possible to separate the carrier plate 3 from the workpiece 7 more easily.

Similarly, vibration of ultrasonic waves or the like may be given to the liquid 44 when a downward force is applied to the outer rim part of the carrier plate 3 by the push component 26 after the carrier plate 3 and the workpiece 7 are immersed in the liquid 44. Specifically, while the vibration of ultrasonic waves or the like is given to the liquid 44, the downward force is applied to the outer rim part of the carrier plate 3 by the push component 26. In this case, due to action of the vibration transmitted from the liquid 44, it becomes possible to separate the carrier plate 3 from the workpiece 7 more easily.

Furthermore, the first modification example may be combined with the second modification example. Specifically, it is also possible to spray fluid onto the temporary bonding layer 5 exposed between the carrier plate 3 and the workpiece 7 before the carrier plate 3 and the workpiece 7 are immersed in the liquid 44 or after they are immersed. Also, in this case, the carrier plate 3 can be separated from the workpiece 7 more easily.

Besides, structures, methods, and so forth according to the above-described embodiment can be implemented with appropriate changes without departing from the range of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A removal method of a carrier plate used when the carrier plate is removed from a workpiece bonded to a region excluding an outer rim part in a front surface of the carrier plate by a temporary bonding layer disposed on a whole of the front surface of the carrier plate, the removal method comprising:
    a temporary bonding layer removal step of removing part or all of an outer rim part of the temporary bonding layer;
    a holding step of holding the workpiece from an upper side by a holding unit after removing part or all of the outer rim part of the temporary bonding layer; and
    a carrier plate removal step of removing the carrier plate from the workpiece by applying a downward force to the outer rim part of the carrier plate from a side of the front surface of the carrier plate by a push component and moving the carrier plate in such a direction as to get further away from the workpiece in a state that the workpiece is held from the upper side.

2. The removal method of a carrier plate according to claim 1, wherein
    in the carrier plate removal step, the downward force is applied to the outer rim part of the carrier plate and the carrier plate is removed from the workpiece after a fluid is sprayed between the workpiece and the carrier plate or while the fluid is sprayed between the workpiece and the carrier plate.

3. The removal method of a carrier plate according to claim 2, wherein
    in the carrier plate removal step, the downward force is applied to the outer rim part of the carrier plate in a state that the workpiece and the carrier plate are immersed in a liquid.

4. The removal method of a carrier plate according to claim 3, wherein
    a surfactant is contained in the liquid.

5. The removal method of a carrier plate according to claim 4, wherein
    in the carrier plate removal step, the downward force is applied to the outer rim part of the carrier plate while vibration is given to the push component in a state that the workpiece and the carrier plate are immersed in the liquid.

6. The removal method of a carrier plate according to claim 4, wherein
    in the carrier plate removal step, the downward force is applied to the outer rim part of the carrier plate while vibration is given to the liquid in a state that the workpiece and the carrier plate are immersed in the liquid.

7. The removal method of a carrier plate according to claim 3, wherein
    in the carrier plate removal step, the downward force is applied to the outer rim part of the carrier plate while vibration is given to the push component in a state that the workpiece and the carrier plate are immersed in the liquid.

8. The removal method of a carrier plate according to claim 3, wherein
    in the carrier plate removal step, the downward force is applied to the outer rim part of the carrier plate while vibration is given to the liquid in a state that the workpiece and the carrier plate are immersed in the liquid.

9. The removal method of a carrier plate according to claim 1, wherein
    in the carrier plate removal step, the downward force is applied to the outer rim part of the carrier plate in a state that the workpiece and the carrier plate are immersed in a liquid.

10. The removal method of a carrier plate according to claim 9, wherein
    a surfactant is contained in the liquid.

11. The removal method of a carrier plate according to claim 10, wherein
    in the carrier plate removal step, the downward force is applied to the outer rim part of the carrier plate while vibration is given to the push component in a state that the workpiece and the carrier plate are immersed in the liquid.

12. The removal method of a carrier plate according to claim 10, wherein
    in the carrier plate removal step, the downward force is applied to the outer rim part of the carrier plate while vibration is given to the liquid in a state that the workpiece and the carrier plate are immersed in the liquid.

13. The removal method of a carrier plate according to claim 9, wherein
    in the carrier plate removal step, the downward force is applied to the outer rim part of the carrier plate while vibration is given to the push component in a state that the workpiece and the carrier plate are immersed in the liquid.

14. The removal method of a carrier plate according to claim 9, wherein
    in the carrier plate removal step, the downward force is applied to the outer rim part of the carrier plate while vibration is given to the liquid in a state that the workpiece and the carrier plate are immersed in the liquid.

* * * * *